United States Patent
Lin

(10) Patent No.: US 11,545,788 B2
(45) Date of Patent: Jan. 3, 2023

(54) TERMINAL ASSEMBLY AND ELECTRICAL CONNECTOR

(71) Applicant: Dongguan Luxshare Technologies Co., Ltd, Dongguan (CN)

(72) Inventor: Yan-Bo Lin, Taipei (TW)

(73) Assignee: DONGGUAN LUXSHARE TECHNOLOGIES CO., LTD, Dongguan (CN)

( * ) Notice: Subject to any disclaimer, the term of this patent is extended or adjusted under 35 U.S.C. 154(b) by 35 days.

(21) Appl. No.: 17/376,704

(22) Filed: Jul. 15, 2021

(65) Prior Publication Data
US 2022/0029359 A1    Jan. 27, 2022

(30) Foreign Application Priority Data
Jul. 24, 2020   (CN) .......................... 202010722708.3

(51) Int. Cl.
*H01R 13/6471* (2011.01)
*H01R 13/6597* (2011.01)
(Continued)

(52) U.S. Cl.
CPC ......... *H01R 13/6471* (2013.01); *H01R 12/57* (2013.01); *H01R 13/516* (2013.01);
(Continued)

(58) Field of Classification Search
CPC .............. H01R 13/6471; H01R 12/724; H01R 13/6587; H01R 12/716; H01R 24/60; H01R 13/6461; H01R 24/50
See application file for complete search history.

(56) References Cited

U.S. PATENT DOCUMENTS

| 6,350,134 | B1 * | 2/2002 | Fogg | H05K 1/0219 |
| | | | | 439/79 |
| 9,806,447 | B2 * | 10/2017 | Kimura | H01R 24/64 |

(Continued)

FOREIGN PATENT DOCUMENTS

| CN | 2699532 Y | 5/2005 |
| CN | 201741958 U | 2/2011 |

(Continued)

OTHER PUBLICATIONS

Chinese Office Action for application No. 202010722708.3 dated Apr. 25, 2021.

(Continued)

*Primary Examiner* — Truc T Nguyen
(74) *Attorney, Agent, or Firm* — Birch, Stewart, Kolasch & Birch, LLP

(57) ABSTRACT

A terminal assembly and an electrical connector, the terminal assembly comprises a plurality of ground terminals, a plurality of signal terminals, and an insulating body. Each ground terminal comprises a ground terminal body, a ground pin, and a plurality of ground assembling pins. The plurality of signal terminals and the plurality of ground terminals are alternately arranged and disposed at intervals along a first direction. At least one signal terminal is disposed between two adjacent ground terminals. Each signal terminal comprises a signal terminal body, a signal pin, and a signal assembling pin. The insulating body is disposed on the plurality of ground terminal bodies and the plurality of signal terminal bodies. A plurality of first distances exist between the plurality of ground pins and the plurality of signal pins. A plurality of second distances exist between the plurality of ground assembling pins and the plurality of signal assembling pins.

27 Claims, 17 Drawing Sheets

(51) Int. Cl.
*H01R 12/57* (2011.01)
*H01R 13/516* (2006.01)
*H05K 1/11* (2006.01)
*H01R 13/6585* (2011.01)

(52) U.S. Cl.
CPC ..... *H01R 13/6585* (2013.01); *H01R 13/6597* (2013.01); *H05K 1/117* (2013.01)

(56) References Cited

U.S. PATENT DOCUMENTS

| | | | |
|---|---|---|---|
| 11,476,603 B2* | 10/2022 | Buck | H01R 12/7047 |
| 2003/0123236 A1 | 7/2003 | McGrath et al. | |
| 2015/0031241 A1* | 1/2015 | Yang | H01R 13/6585 |
| | | | 439/607.08 |
| 2018/0366879 A1 | 12/2018 | Zhou et al. | |
| 2019/0089097 A1 | 3/2019 | Cho et al. | |
| 2019/0350079 A1* | 11/2019 | Chen | H01R 12/737 |
| 2020/0303854 A1* | 9/2020 | Jin | H01R 13/6477 |
| 2021/0135403 A1* | 5/2021 | Yang | H01R 13/6471 |
| 2021/0159642 A1* | 5/2021 | Yang | H01R 13/6471 |

FOREIGN PATENT DOCUMENTS

| | | |
|---|---|---|
| CN | 103117463 A | 5/2013 |
| CN | 103477503 A | 12/2013 |
| CN | 103928794 A | 7/2014 |
| CN | 104701677 A | 6/2015 |
| CN | 105470675 A | 4/2016 |
| CN | 206673232 U | 11/2017 |
| CN | 209045918 U | 6/2019 |
| CN | 111293451 A | 6/2020 |
| EP | 2 234 221 B1 | 9/2013 |
| TW | M253919 U | 12/2004 |
| TW | 201810813 A | 3/2018 |
| TW | M572584 U | 1/2019 |

OTHER PUBLICATIONS

Taiwan Office Action for application No. 109131564 dated Apr. 27. 2021.

* cited by examiner

TERMINAL ASSEMBLY AND ELECTRICAL CONNECTOR

CROSS-REFERENCE TO RELATED APPLICATION

This application claims the priority benefit of Chinese Patent Application Serial Number CN202010722708.3, filed on Jul. 24, 2020, the full disclosure of which is incorporated herein by reference.

BACKGROUND

Technical Field

The present disclosure relates to the technical field of connectors, particularly to a terminal assembly and an electrical connector.

Related Art

Conventional connectors comprise a plurality of ground terminals and a plurality of signal terminals, wherein a signal terminal is disposed between two adjacent ground terminals. The two grounding terminals at two ends of the signal terminal could shield the signal terminal so that the signal terminal would not be affected by environmental interferences, and the energy of the signal terminal is not prone to lose. However, the width of the ground terminal is the same as the width of the signal terminal, so that the connector cannot conduct excellent SI performance.

SUMMARY

The embodiments of the present disclosure provide a terminal assembly and an electrical connector to solve the problem that the connectors do not perform SI in excellence due to the conventional terminal assembly installed within.

On the first aspect, a terminal assembly is provided, which comprises a plurality of ground terminals, a plurality of signal terminals, and an insulating body. Each of the ground terminals comprises a ground terminal body, a ground pin, and a plurality of ground assembling pins. The ground pin is disposed at one end of the ground terminal body. The plurality of ground assembling pins is disposed at the other end of the ground terminal body at intervals. The plurality of signal terminals and the plurality of ground terminals are alternately arranged and disposed at intervals along a first direction. At least one signal terminal is disposed between two adjacent ground terminals. Each of the signal terminals comprises a signal terminal body, a signal pin, and a signal assembling pin. The signal pin and the signal assembling pin are respectively disposed at two ends of the signal terminal body. The insulating body is disposed on the plurality of ground terminal bodies and the plurality of signal terminal bodies. A plurality of first distances exist between the plurality of ground pins and the plurality of signal pins. A plurality of second distances exist between the plurality of ground assembling pins and the plurality of signal assembling pins. The first distance is greater than the second distance.

On the second aspect, an electrical connector is provided, which comprises a connector body, two terminal assemblies according to the first aspect, and a circuit board. The connector body comprises an accommodating groove. The two terminal assemblies are stacked in the accommodating groove. The circuit board is disposed on the connector body. A surface of the circuit board close to the connector body is provided with a plurality of conductive pads arranged along the first direction at intervals. The plurality of the ground assembling pins and the plurality of the signal assembling pins are respectively soldered to the corresponding conductive pads.

In the embodiments of the present disclosure, by disposing a plurality of ground assembling pins on one ground terminal, the width of the ground terminal can be increased and the signal terminal between the two ground terminals can be effectively protected. Meanwhile, since the distance between the plurality of ground assembling pins and the plurality of signal assembling pins is smaller than the distance between the plurality of ground pins and the plurality of signal pins, the electrical connector using the terminal assembly of the present disclosure could conduct excellent signal transmission rate and SI performance.

It should be understood, however, that this summary may not contain all aspects and embodiments of the present disclosure, that this summary is not meant to be limiting or restrictive in any manner, and that the disclosure as disclosed herein will be understood by one of ordinary skill in the art to encompass obvious improvements and modifications thereto.

BRIEF DESCRIPTION OF THE DRAWINGS

The features of the exemplary embodiments believed to be novel and the elements and/or the steps characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

DETAILED DESCRIPTION OF THE EMBODIMENTS

Figure 1:
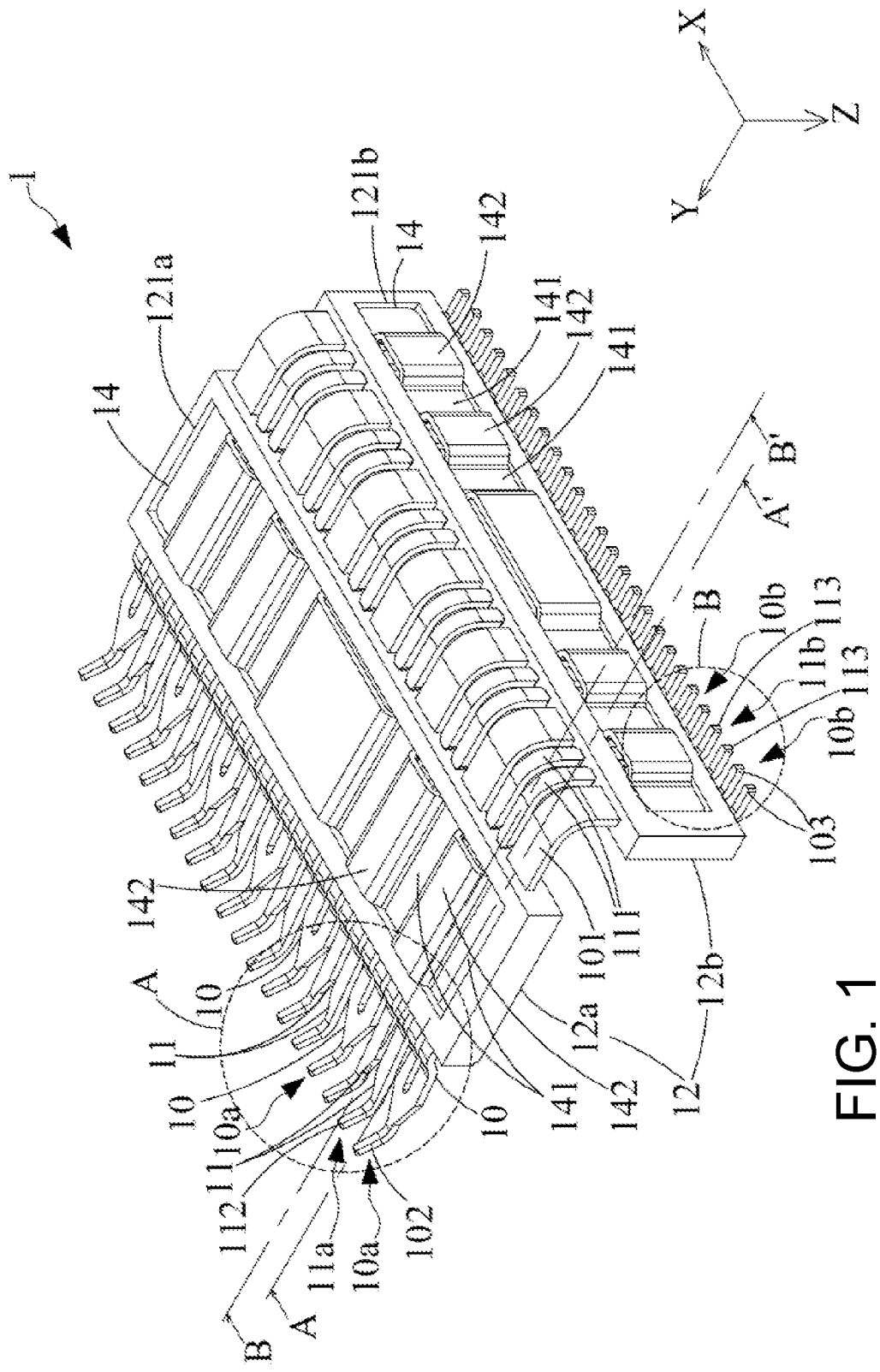
FIG. 1 is a perspective view of a terminal assembly of the first embodiment of the present disclosure.

The present disclosure will now be described more fully hereinafter with reference to the accompanying drawings, in which exemplary embodiments of the disclosure are shown. This present disclosure may, however, be embodied in many different forms and should not be construed as limited to the embodiments set forth herein. Rather, these embodiments are provided so that this present disclosure will be thorough and complete, and will fully convey the scope of the present disclosure to those skilled in the art.

Certain terms are used throughout the description and following claims to refer to particular components. As one skilled in the art will appreciate, manufacturers may refer to a component by different names. This document does not intend to distinguish between components that differ in name but function. In the following description and in the claims, the terms "include/including" and "comprise/comprising" are used in an open-ended fashion, and thus should be interpreted as "including but not limited to". "Substantial/substantially" means, within an acceptable error range, the person skilled in the art may solve the technical problem in a certain error range to achieve the basic technical effect.

The following description is of the best-contemplated mode of carrying out the disclosure. This description is made for the purpose of illustration of the general principles of the disclosure and should not be taken in a limiting sense. The scope of the disclosure is best determined by reference to the appended claims.

Moreover, the terms "include", "contain", and any variation thereof are intended to member a non-exclusive inclusion. Therefore, a process, method, object, or device that includes a series of elements not only includes these elements, but also includes other elements not specified expressly, or may include inherent elements of the process, method, object, or device. If no more limitations are made, an element limited by "include a/an . . . " does not exclude other same elements existing in the process, the method, the article, or the device which includes the element.

In the following embodiment, the same reference numerals are used to refer to the same or similar elements throughout the disclosure.

Regarding the "first", "second", etc. used in this article, it does not specifically refer to the order or sequence, nor is it intended to limit the application, but only to distinguish between components or operations described in the same technical terms.

Figure 2:
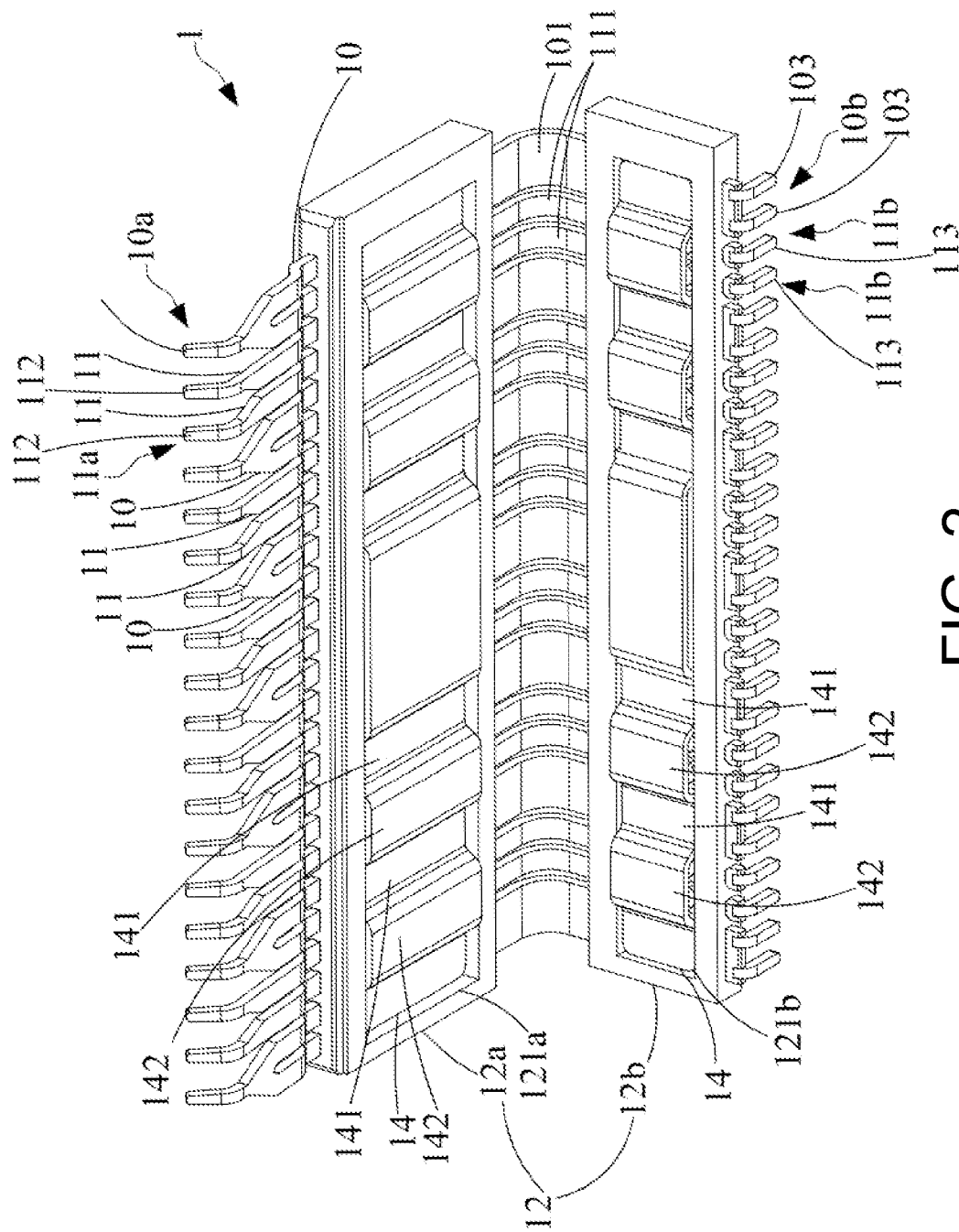
FIG. 2 is another perspective view of the terminal assembly of the first embodiment of the present disclosure.

FIG. 1 and FIG. 2 are perspective views of a terminal assembly of the first embodiment of the present disclosure. As shown in the figures, the terminal assembly 1 of this embodiment comprises a plurality of ground terminals 10, a plurality of signal terminals 11, and an insulating body 12. The plurality of ground terminals 10 and the plurality of signal terminals 11 are disposed along a first direction X at intervals. At least one signal terminal 11 is disposed between two adjacent ground terminals 10, and the two signal terminals 11 form a differential signal pair. The insulating body 12 is disposed at the plurality of ground terminals 10 and the plurality of signal terminals 11. In this embodiment, the insulating body 12 is formed by inject-molding on the plurality of ground terminals 10 and the plurality of signal terminals 11.

In this embodiment, each of the ground terminals 10 comprises a ground terminal body 101, a ground pin 102, and a plurality of ground assembling pins 103. The ground pin 102 is disposed at one end of the ground terminal body 101, and the plurality of ground assembling pins 103 are disposed on the other end of the ground terminal body 101 at intervals. Thus, one end of the ground terminal 10 having the ground pin 102 is a ground plugging end 10a of the ground terminal 10, and one end of the ground terminal 10 having the plurality of ground assembling pins 103 is a ground connecting end 10b of the ground terminal 10. In this embodiment, the number of ground assembling pins 103 of each of the ground terminals 10 is two.

Each of the signal terminals 11 comprises a signal terminal body 111, a signal pin 112, and a signal assembling pin 113. The signal pin 112 is disposed at one end of the signal terminal body 111, and the signal assembling pin 113 is disposed at the other end of the signal terminal body 111. Thus, one end of the signal terminal 11 having the signal pin 112 is a signal plugging end 11a of the signal terminal 11, and one end of the signal terminal 11 having the signal assembling pin 113 is a signal connecting end 11b of the signal terminal 11. The insulating body 12 is disposed on the ground terminal body 101 of each of the ground terminals 10 and on the signal terminal body 111 of each of the signal terminals 11, and covers a part of the ground terminal body 101 and a part of the signal terminal body 111. In this embodiment, the assembling pins (such as the ground assembling pin 103 and the signal assembling pin 113) can be a soldering component or a fisheye component and is described in a soldering component manner.

Figure 3:
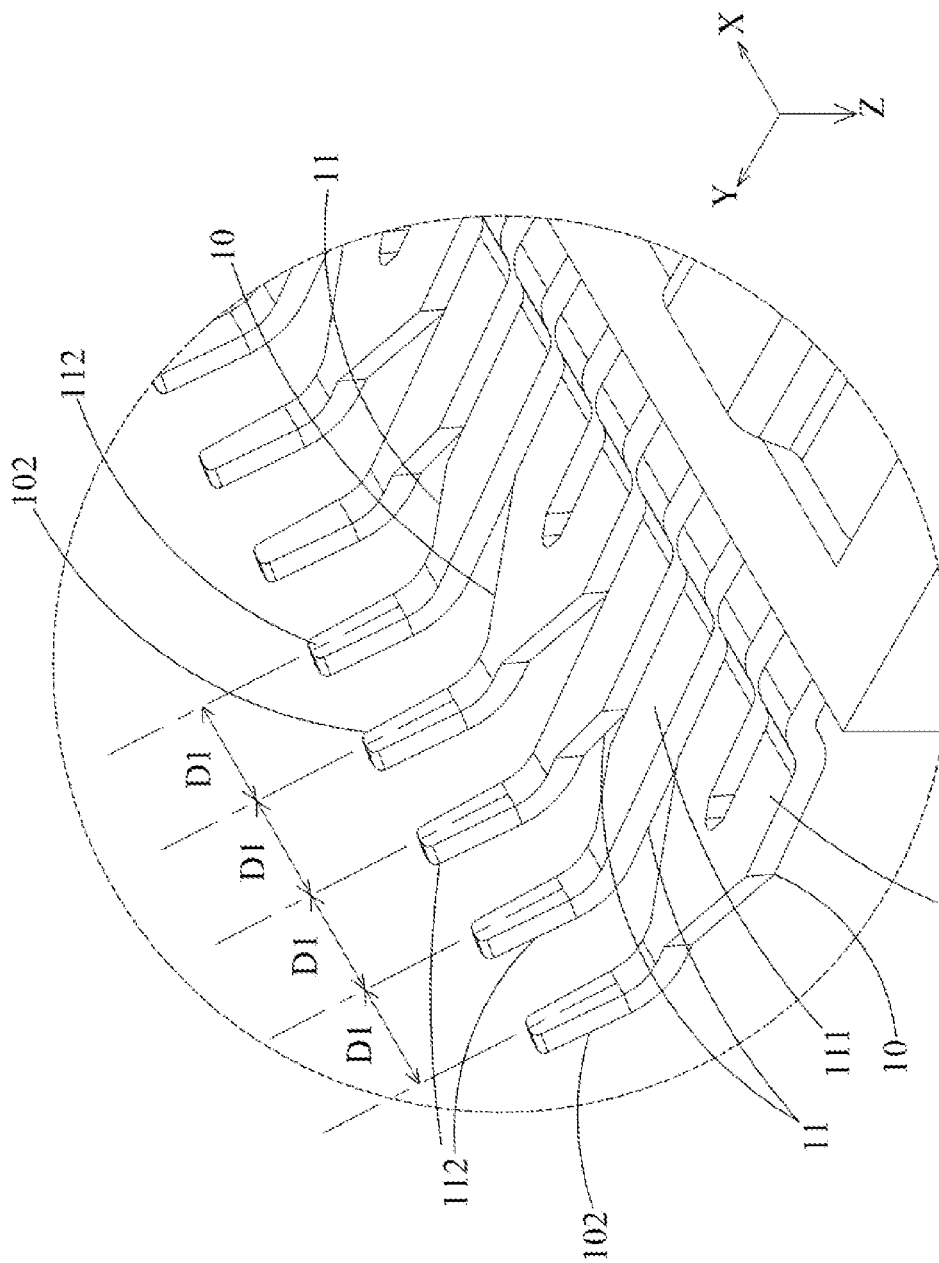
FIG. 3 is an enlarged view of area A of FIG. 1.
Figure 4:
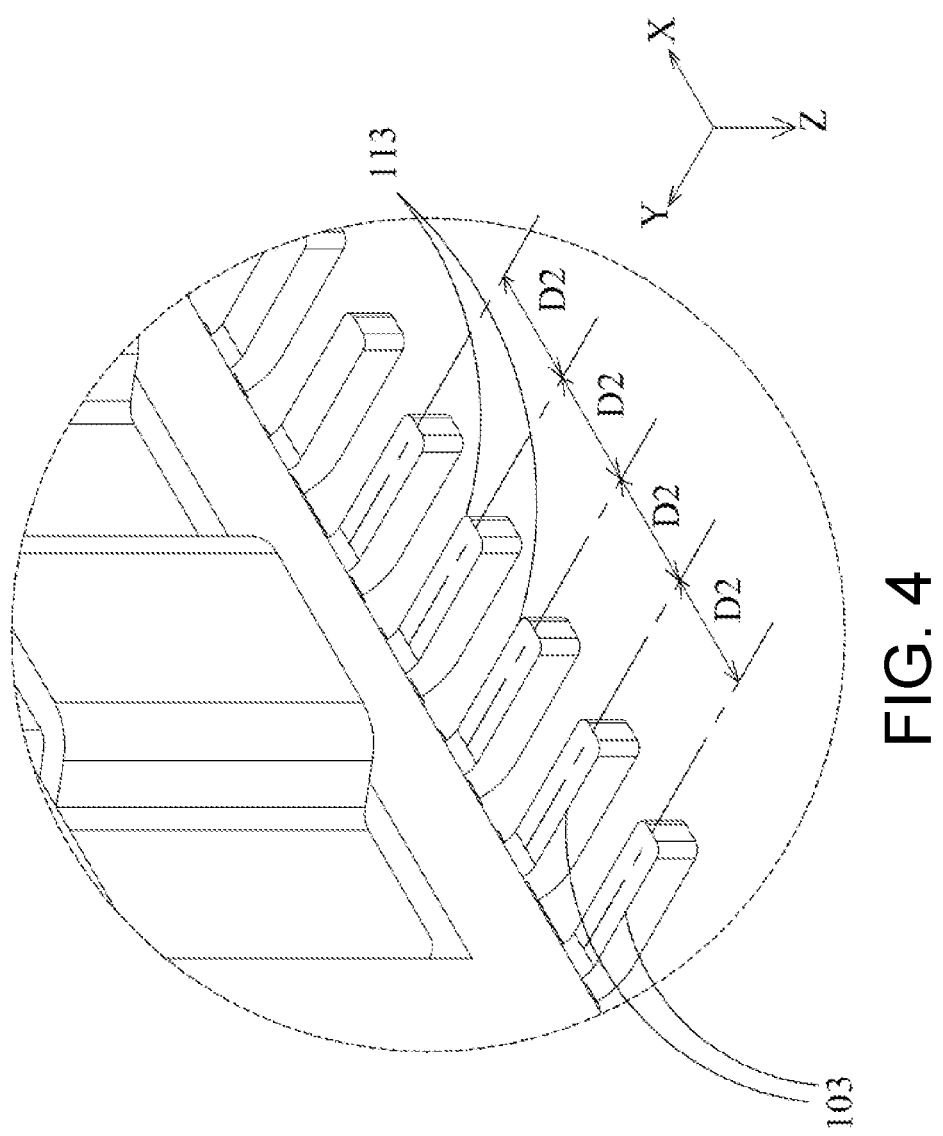
FIG. 4 is an enlarged view of area B of FIG. 1.

In this embodiment, the plurality of ground terminals 10 and the plurality of signal terminals 11 are disposed along the first direction X at intervals. Hence, the plurality of ground pins 102 and the plurality of signal pins 112 are also disposed along the first direction X at intervals, and the plurality of ground assembling pins 103 and the plurality of signal assembling pins 113 are also disposed along the first direction X at intervals. FIG. 3 is an enlarged view of area A of FIG. 1. FIG. 4 is an enlarged view of area B of FIG. 1. As shown in the figures, a plurality of first distances D1 exist between the plurality of ground pins 102 and the plurality of signal pins 112. The first distance D1 is disposed between two adjacent signal pins 112 or between the ground pin 102 and signal pin 112 adjacent to the ground pin 102. This means that the distance between two adjacent signal pins 112 is identical to the distance between the ground assembling pin 103 and the signal assembling pin 113 adjacent to the ground assembling pin 103. Each of the ground pins 102 and each of the signal pins 112 respectively comprise a centerline perpendicular to the first direction X. The first distance D1 refers to a distance between the two centerlines of two adjacent signal pins 112, or a distance between the adjacent centerlines of the ground pin 102 and the signal pin 112.

A plurality of second distances D2 exist between the plurality of ground assembling pins 103 and the plurality of signal assembling pins 113. The second distance D2 is disposed between two adjacent ground assembling pins 103, between two adjacent signal assembling pins 113, or between the ground assembling pin 103 and signal assembling pin 113 adjacent to the ground assembling pin 103. This means that the distance between two adjacent ground assembling pins 103, the distance between two adjacent signal assembling pins 113, and the distance between the ground assembling pin 103 and signal assembling pin 113 adjacent to the ground assembling pin 103 are the same. Each of the ground assembling pins 103 and each of the signal assembling pins 113 respectively comprise a centerline perpendicular to the first direction X. The second distance D2 refers to a distance between the two centerlines of two adjacent signal assembling pins 113, a distance between the two centerlines of two adjacent grounding assembling pins 103, or a distance between the centerline of the ground assembling pin 103 and the centerline of the signal assembling pin 113 adjacent to the ground assembling pin 103. In this embodiment, the first distance D1 is greater than the second distance D2, and the first distance D1 is 0.8 mm, the second distance D2 is 0.6 mm.

In this embodiment, the ground connecting end 10b of each of the ground terminals 10 comprises a plurality of ground assembling pins 103. The plurality of second distances D2 between the plurality of ground assembling pins 103 and the plurality of signal assembling pins 113 are all the same, so the width of the ground terminal body 101 of each of the ground terminals 10 in the first direction X is wider than the width of the signal terminal body 111 of each of the signal terminals 11 in the first direction X (see FIG. 3). When the terminal assembly 1 of this embodiment is applied to an electrical connector, two adjacent ground terminals 10 can effectively shield and protect at least one signal terminal 11 disposed therein due to the ample width of each of the ground terminals 10. Thus, the at least one signal terminal 11 is difficult to be affected by external interferences and the energy of the signal terminal 11 is prone to stay within rather than to escape. In this way, the signal transmission rate of the electrical connector using the terminal assembly 1 of this embodiment can be increased, and the electrical connector can perform excellent SI performance.

Figure 5:
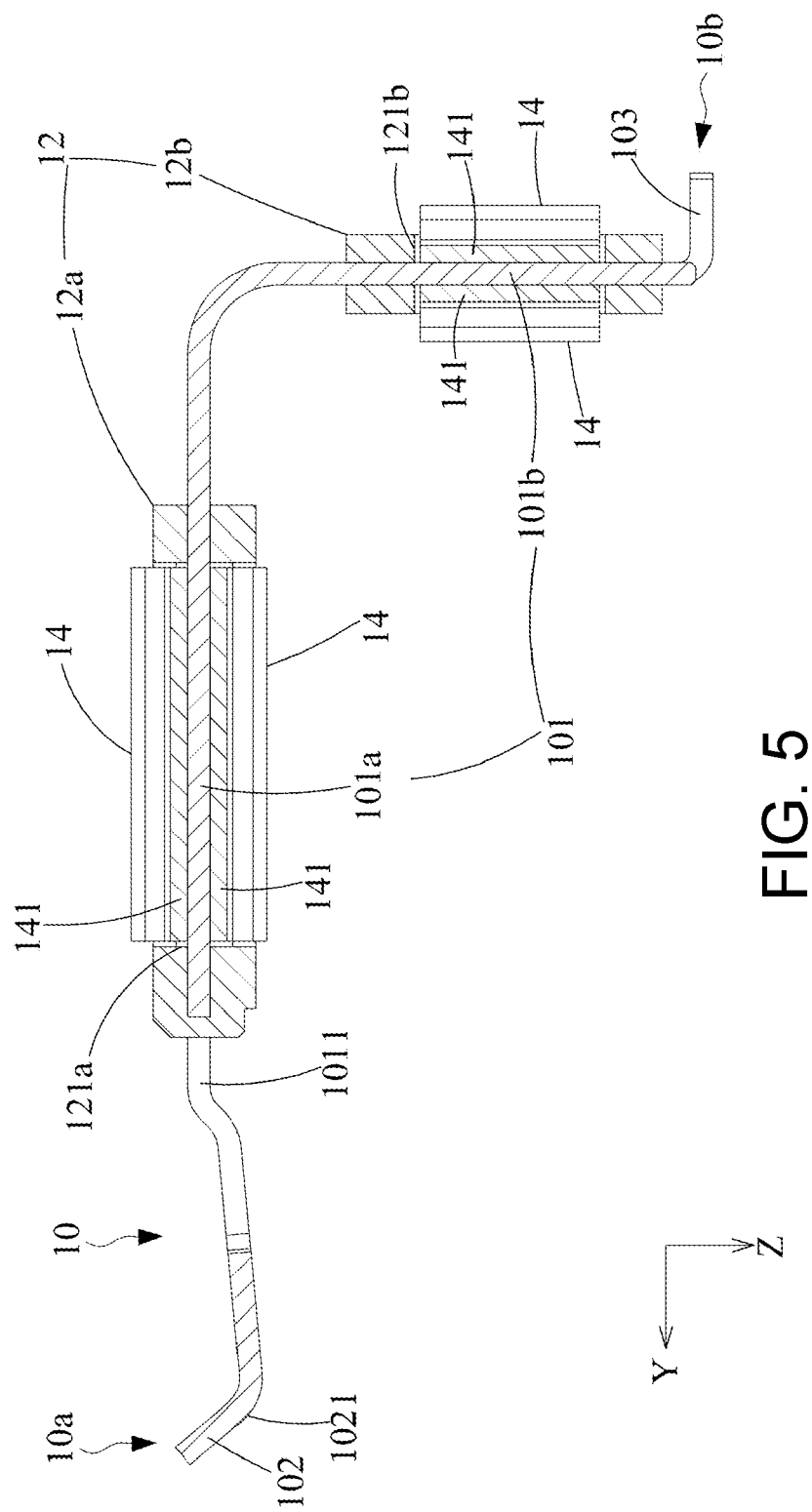
FIG. 5 is a cross-sectional view along line A-A' of FIG. 1.
Figure 6:
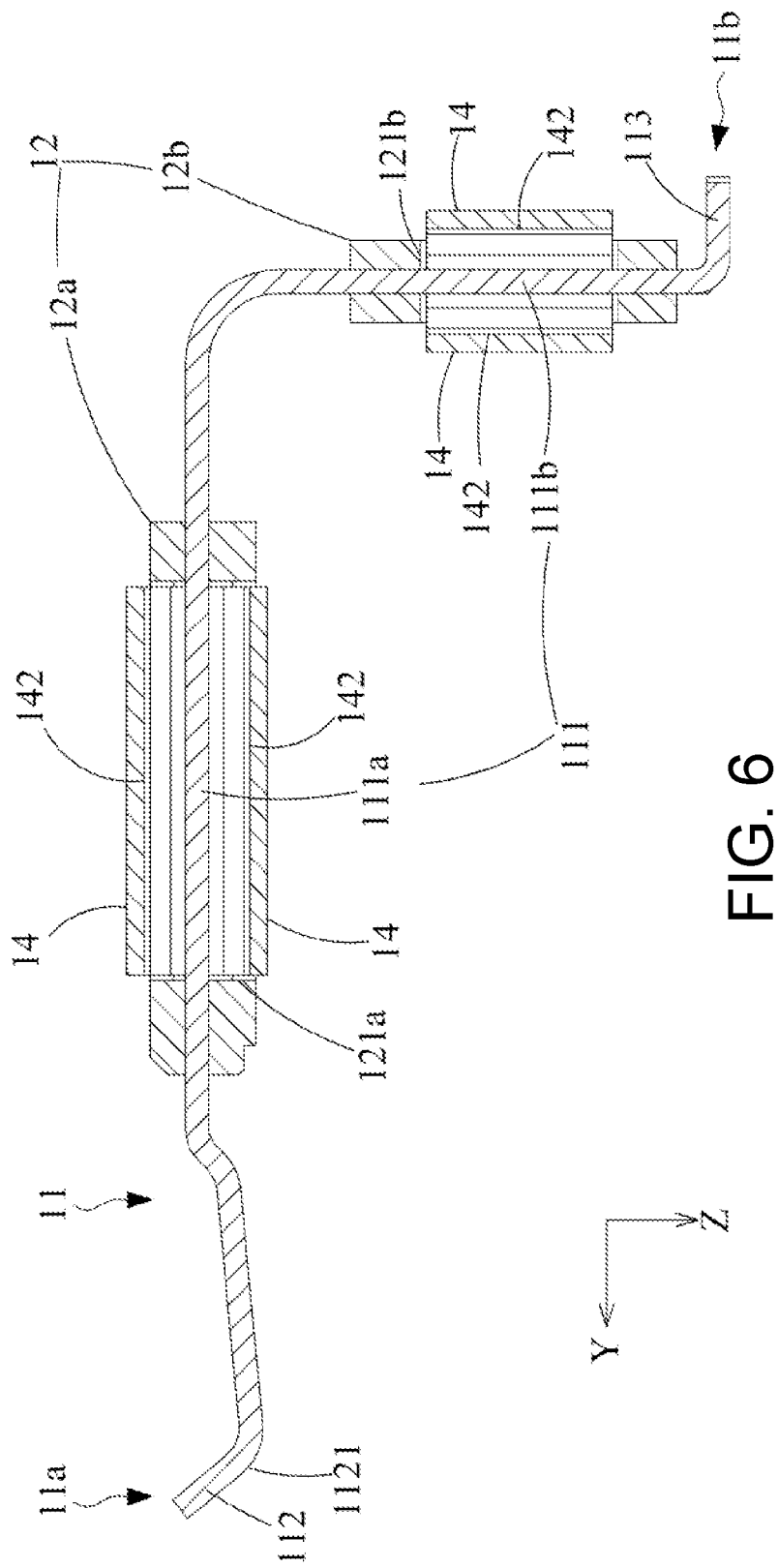
FIG. 6 is a cross-sectional view along line B-B' of FIG. 1.

FIG. 5 is a cross-sectional view along line A-A' of FIG. 1. FIG. 6 is a cross-sectional view along line B-B' of FIG. 1. In this embodiment, as shown in the figures, the ground terminal body 101 of each of the ground terminals 10 and the signal terminal body 111 of each of the signal terminals 11 are bent-shaped. The ground terminal body 101 of each of the ground terminals 10 comprises a first ground end part 101a and a second ground end part 101b. The first ground end part 101a is close to the ground plugging end 10a of the ground terminal 10, and the second ground end part 101b is close to the ground connecting end 10b of the ground terminal 10. That is, the ground pin 102 is disposed at one end of the first ground end part 101a away from the second ground end part 101b, and the plurality of ground assembling pins 103 are disposed on one end of the second ground end part 101b away from the first ground end part 101a at intervals. In this embodiment, the extending direction of the second ground end part 101b is orthogonal to the extending direction of the first ground end part 101a, the plurality of first ground end parts 101a of the plurality of ground terminals 10 are arranged in parallel, and the plurality of second ground end parts 101b of the plurality of ground terminals 10 are arranged in parallel.

The signal terminal body 111 of each of the signal terminals 11 comprises a first signal end part 111a and a second signal end part 111b. The first signal end part 111a is close to the signal plugging end 11a of the signal terminal 11, and the second signal end part 111b is close to the signal connecting end 11b of the signal terminal 11. That is, the signal pin 112 is disposed at one end of the first signal end part 111a away from the second signal end part 111b, and the signal assembling pin 113 is disposed at one end of the second signal end part 111b away from the first signal end part 111a. In this embodiment, the extending direction of the second signal end part 111b is orthogonal to the extending direction of the first signal end part 111a, the plurality of first signal end parts 111a of the plurality of signal terminals 11 are arranged in parallel, and the plurality of second signal end parts 111b of the plurality of signal terminals 11 are arranged in parallel.

When a plurality of ground terminals 10 and a plurality of signal terminals 11 are arranged along the first direction X at intervals, the plurality of first signal end parts 111a of the plurality of signal terminals 11 are parallel to the plurality of first ground end parts 101a of the plurality of ground terminals 10, and the plurality of first signal end parts 111a of the plurality of signal terminals 11 and the plurality of first ground end parts 101a of the plurality of ground terminals 10 would extend along the second direction Y; the plurality of second signal end parts 111b of the plurality of signal terminals 11 are parallel to the plurality of second ground end parts 101b of the plurality of ground terminals 10, and the plurality of second signal end parts 111b of the plurality of signal terminals 11 and the plurality of second ground end parts 101b of the plurality of ground terminals 10 would extend along the third direction Z. The first direction X and the second direction Y are orthogonal to the third direction Z.

When the ground terminal body 101 of each of the ground terminals 10 and the signal terminal body 111 of each of the signal terminals 11 are bent, the extending direction of each of the ground assembling pins 103 of each of the ground terminals 10 is orthogonal to the extending direction of the second ground end part 101b. That is, each of the ground assembling pins 103 of each of the ground terminals 10 extends along the second direction Y. The extending direction of the signal assembling pin 113 of each of the signal terminals 11 is orthogonal to the extending direction of the second signal end part 111b. That is, each of the signal assembling pins 113 of each of the signal terminals 11 extends along the second direction Y. In this way, it would be beneficial for connection between the ground assembling pins 103 and the signal assembling pins 113 and the circuit board.

The extending direction of the ground pin 102 of each of the ground terminals 10 is parallel to the extending direction of the first ground end part 101a of each of the ground terminals 10 which means that the ground pin 102 of each of the ground terminals 10 extends along the second direction Y. The extending direction of the signal pin 112 of each of the signal terminals 11 is parallel to the extending direction of the first signal end part 111a of each of the signal terminals 11, which means that the signal pin 112 of each of the signal terminals 11 extends along the second direction Y. The plurality of ground pins 102 and the plurality of signal pins 112 of this embodiment are bent-shaped, allowing each of the ground pins 102 to comprise a ground contacting bump 1021 and each of the signal pins 112 to comprise a signal contacting bump 1121. Each of the ground contacting bumps 1021 and each of the signal contacting bumps 1121 protrude along the third direction Z. That is, the ground contacting bump 1021 and the signal contacting bump 1121 could protrude in an upward or downward direction.

In one embodiment, the shape of one end of the ground terminal body 101 of each of the ground terminals 10 close to the ground plugging end 10a is tapered, which shows the width of one end of the ground terminal body 101 connected to the ground pin 102 in the first direction X is narrower than the width of the ground terminal body 101 in the first direction X and is equal to the width of the ground pin 102 in the first direction X. Similarly, the shape of one end of the signal terminal body 111 of each of the signal terminals 11 close to the signal plugging end 11a is tapered which shows the width of one end of the signal terminal body 111 connected to the signal pin 112 in the first direction X is narrower than the width of the signal terminal body 111 in the first direction X and is equal to the width of the signal pin 112 in the first direction X. In this way, the distance between one end of the ground terminal body 101 close to the ground plugging end 10a and one end of the signal terminal body 111 close to the signal plugging end 11a can be increased to avoid affecting the signal transmission performance of the electrical connector using the terminal assembly 1 of this embodiment.

Figure 7:
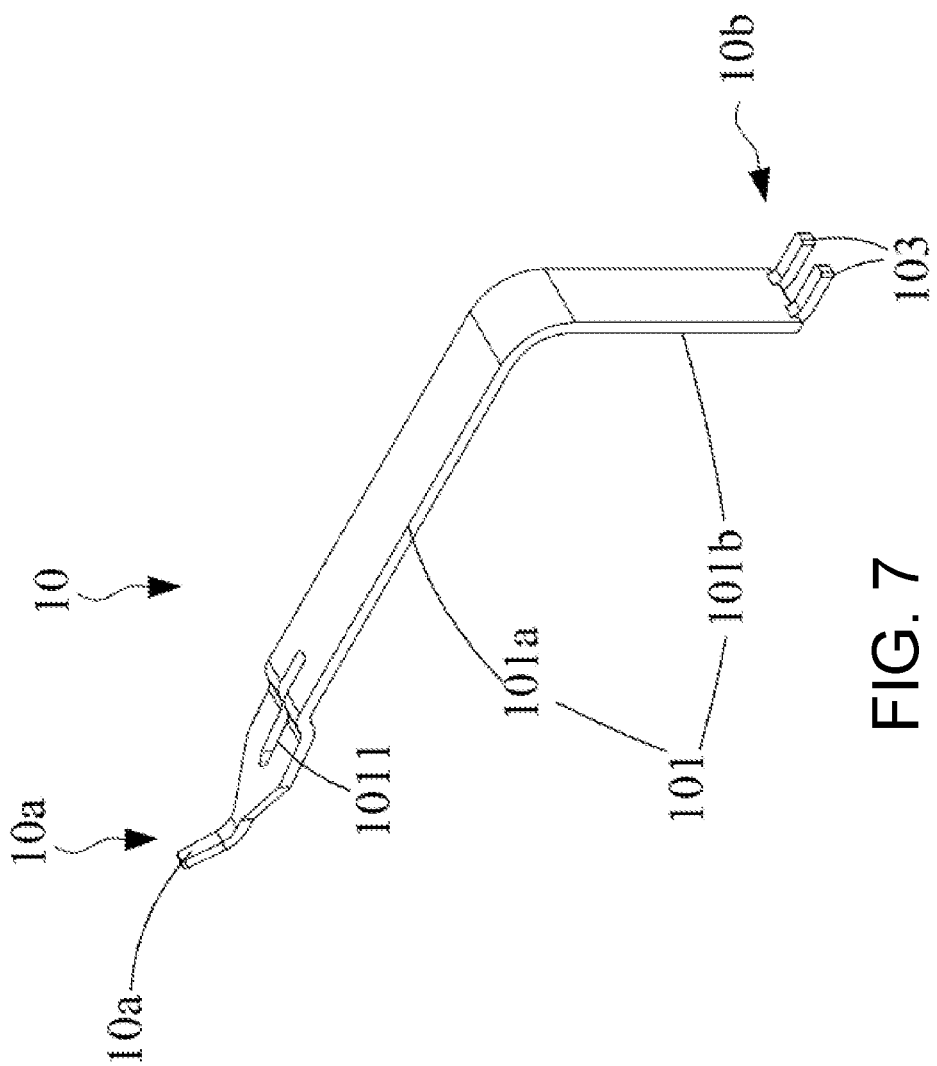
FIG. 7 is a perspective view of a ground terminal of the first embodiment of the present disclosure.

FIG. 7 is a perspective view of a ground terminal of the first embodiment of the present disclosure. In one embodiment, as shown in the figure, the ground terminal body 101 of each of the ground terminals 10 comprises an opening groove 1011, which is openly disposed on the ground terminal body 101, more particular, is openly disposed on the first ground end part 101a of the ground terminal body 101. The opening groove 1011 extends from one end of the ground terminal body 101 close to the ground pin 102 along the second direction Y toward the ground assembling pin 103, which could increase the elasticity of the ground plugging end 10a of the ground terminal 10.

In one embodiment, the insulating body 12 comprises a first insulator 12a and a second insulator 12b which are individually disposed. The first insulator 12a is disposed on the plurality of first ground end parts 101a of the plurality of ground terminals 10 and on the plurality of first signal end parts 111a of the plurality of signal terminals 11, and the second insulator 12b is disposed on the plurality of second ground end parts 101b of the plurality of ground terminals 10 and on the plurality of second signal end parts 111b of the plurality of signal terminals 11. The first insulator 12a comprises a first hollow part 121a, which penetrates the first insulator 12a along the third direction Z. The plurality of first ground end parts 101a of the plurality of ground terminals 10 and the plurality of first signal end parts 111a of the plurality of signal terminals 11 are exposed from the first hollow part 121a. The second insulator 12b comprises a second hollow part 121b, which penetrates the second insulator 12b along the second direction Y. The plurality of second ground end parts 101b of the plurality of ground terminals 10 and the plurality of second signal end parts 111b of the plurality of signal terminals 11 are exposed from the second hollow part 121b.

In one embodiment, the terminal assembly 1 further comprises a plurality of electromagnetic shielding members 14, which are respectively disposed in the first hollow part 121a of the first insulator 12a and the second hollow part 121b of the second insulator 12b. In this embodiment, the first hollow part 121a is provided with two electromagnetic shielding members 14, which are respectively disposed above the plurality of first ground end parts 101a of the plurality of ground terminals 10 and below the plurality of first signal end parts 111a of the plurality of signal terminals 11. The two electromagnetic shielding members 14 are respectively in contact with the plurality of first ground end parts 101a of the plurality of ground terminal bodies 101. Similarly, the second hollow part 121b is provided with two electromagnetic shielding members 14, which are respectively disposed above the plurality of second ground end parts 101b of the plurality of ground terminals 10 and below the plurality of second signal end parts 111b of the plurality of signal terminals 11. The two electromagnetic shielding members 14 are respectively in contact with the plurality of second ground end parts 101b of the plurality of ground terminal bodies 101. Thus, the mutual interference of the plurality of signal terminals 11 can be avoided by the electromagnetic shielding member 14, allowing the electrical connector using the terminal assembly 1 of this embodiment to perform excellent transmission.

In this embodiment, a surface of each of the electromagnetic shielding members 14 close to the plurality of ground terminals 10 and the plurality of signal terminals 11 is provided with a plurality of bumps 141 and a plurality of recesses 142 alternately arranged. That is, each of the recesses is disposed between two adjacent bumps 141. The plurality of bumps 141 of the electromagnetic shielding member 14 are contactingly connected with the plurality of ground terminal bodies 101 of the plurality of ground terminals 10, respectively. The plurality of recesses correspond to the plurality of signal terminal bodies. The plurality of recesses 142 respectively correspond to the plurality of signal terminal bodies 111 of the plurality of signal terminals 11. In this embodiment, the electromagnetic shielding member is wave-shaped.

In another embodiment, the second insulator 12b is omitted in the terminal assembly 1, showing that the insulating body 12 is only provided on the plurality of first ground end parts 101a of the plurality of ground terminals 10 and the plurality of first signal end parts 111a of the plurality of signal terminals 11. The insulating body 12 comprises a hollow part penetrating along the third direction Z. The plurality of ground terminal bodies 101 and the plurality of signal terminal bodies 111 are exposed from the hollow part. Two electromagnetic shielding members 14, disposed in the hollow part, can be contactingly connected with the plurality of connected terminal bodies 101. The electromagnetic shielding member 14 can also be directly disposed in the plurality of ground terminal bodies 101 and a plurality of signal terminal bodies 111, for example, on the plurality of second ground end parts 101b and the plurality of second signal end parts 111b.

Figure 8:
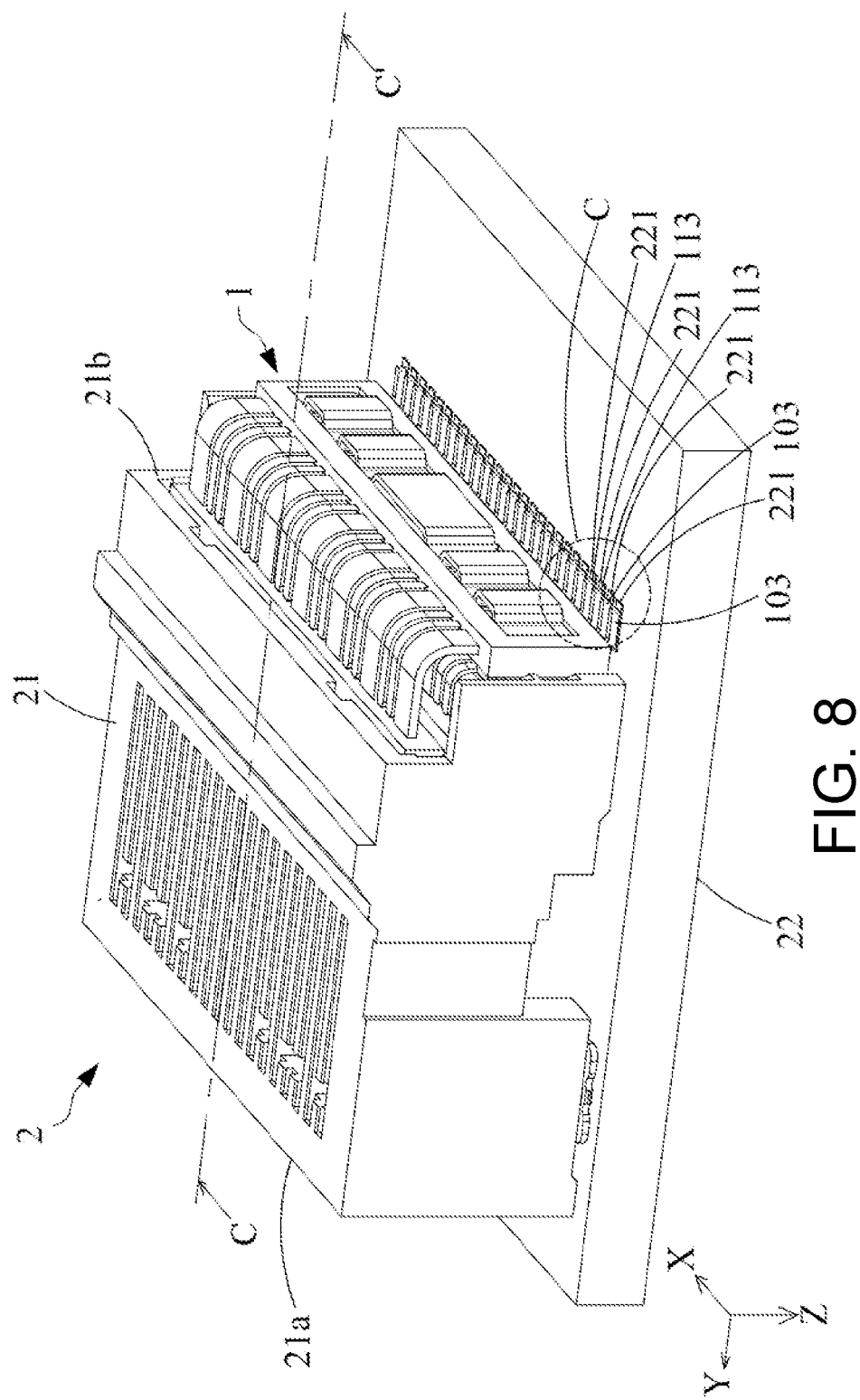
FIG. 8 is a perspective view of an electrical connector of the second embodiment of the present disclosure.
Figure 9:
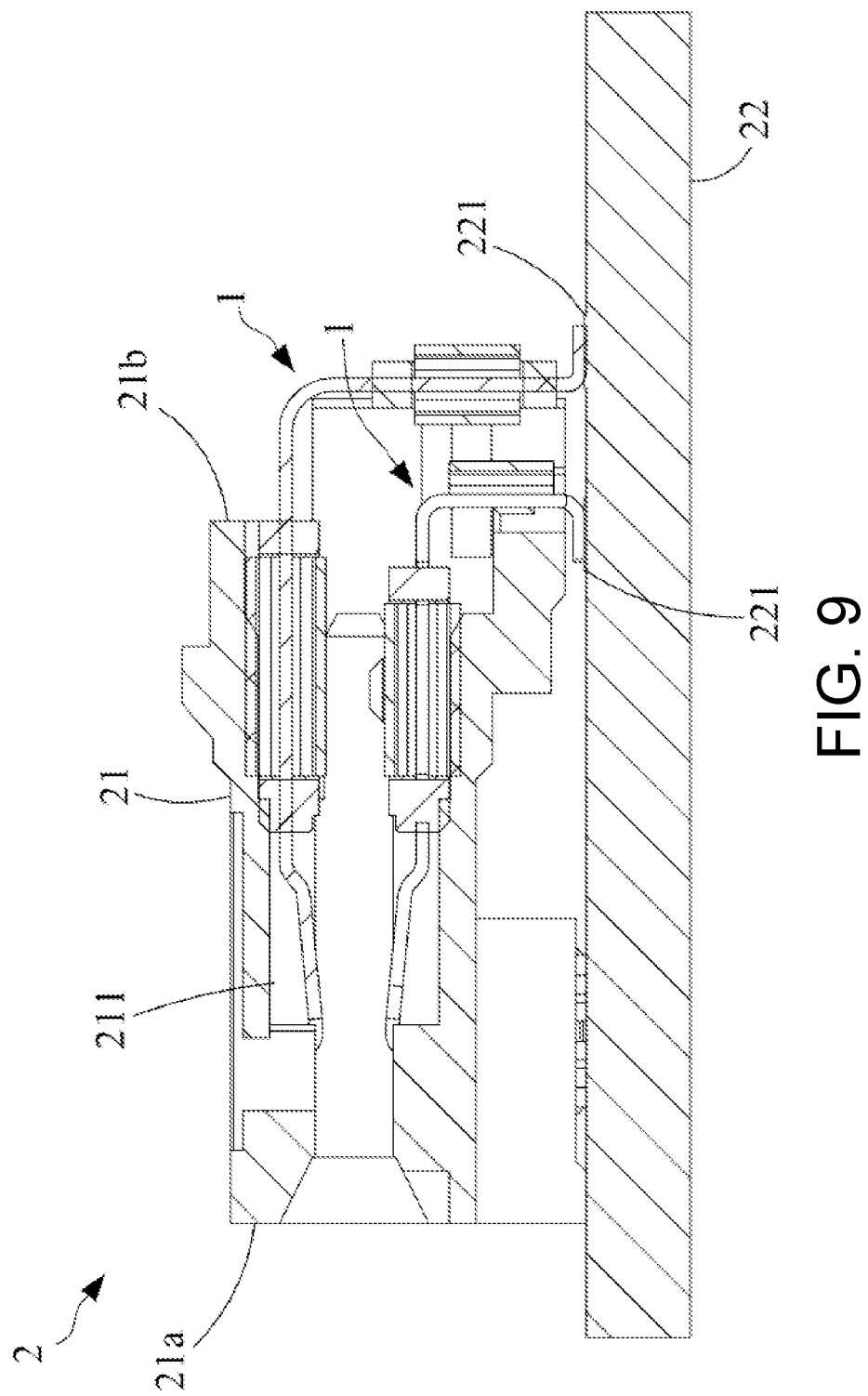
FIG. 9 is a cross-sectional view along line C-C' of FIG. 8.
Figure 10:
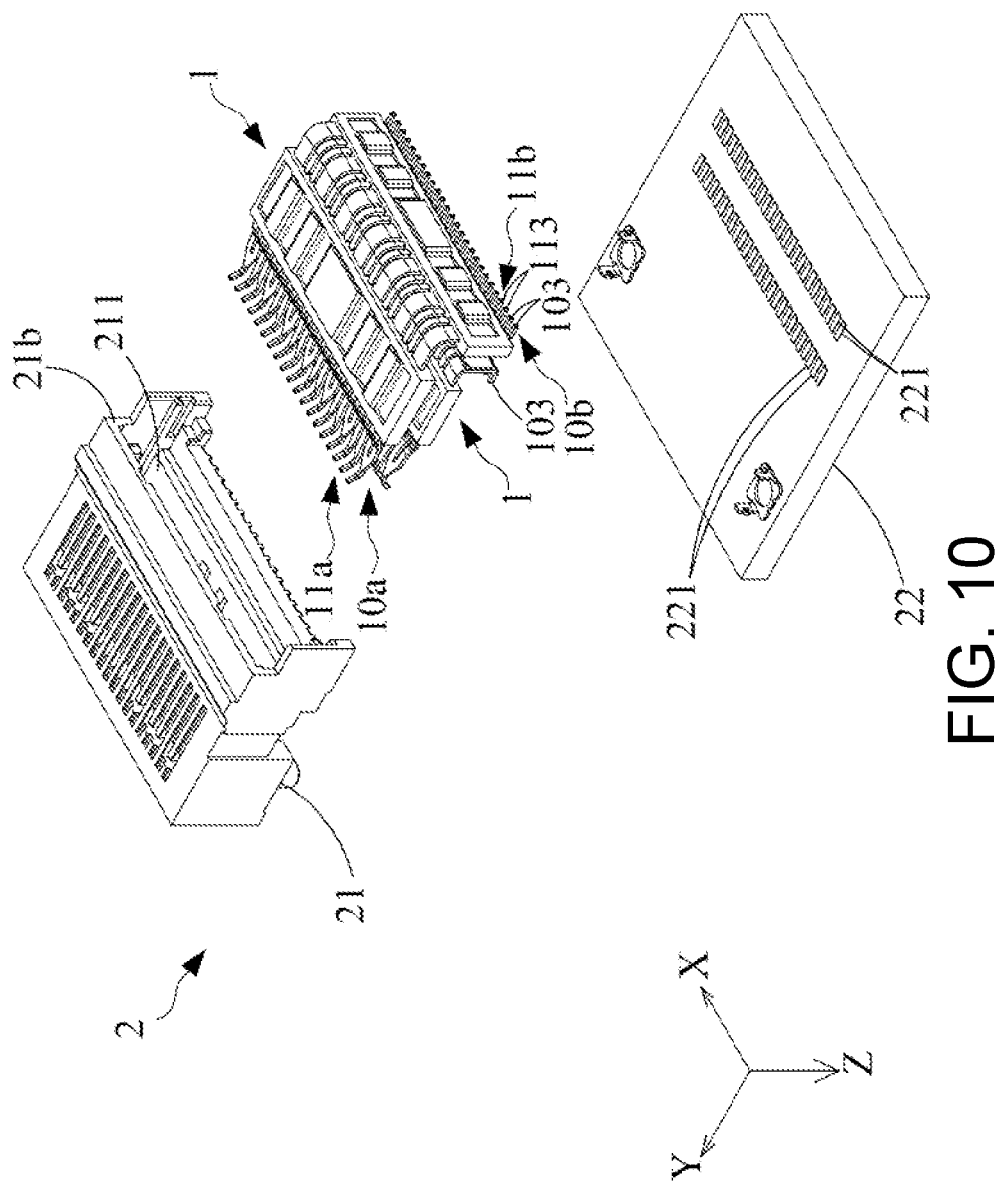
FIG. 10 is an exploded view of the electrical connector of the second embodiment of the present disclosure.
Figure 11:
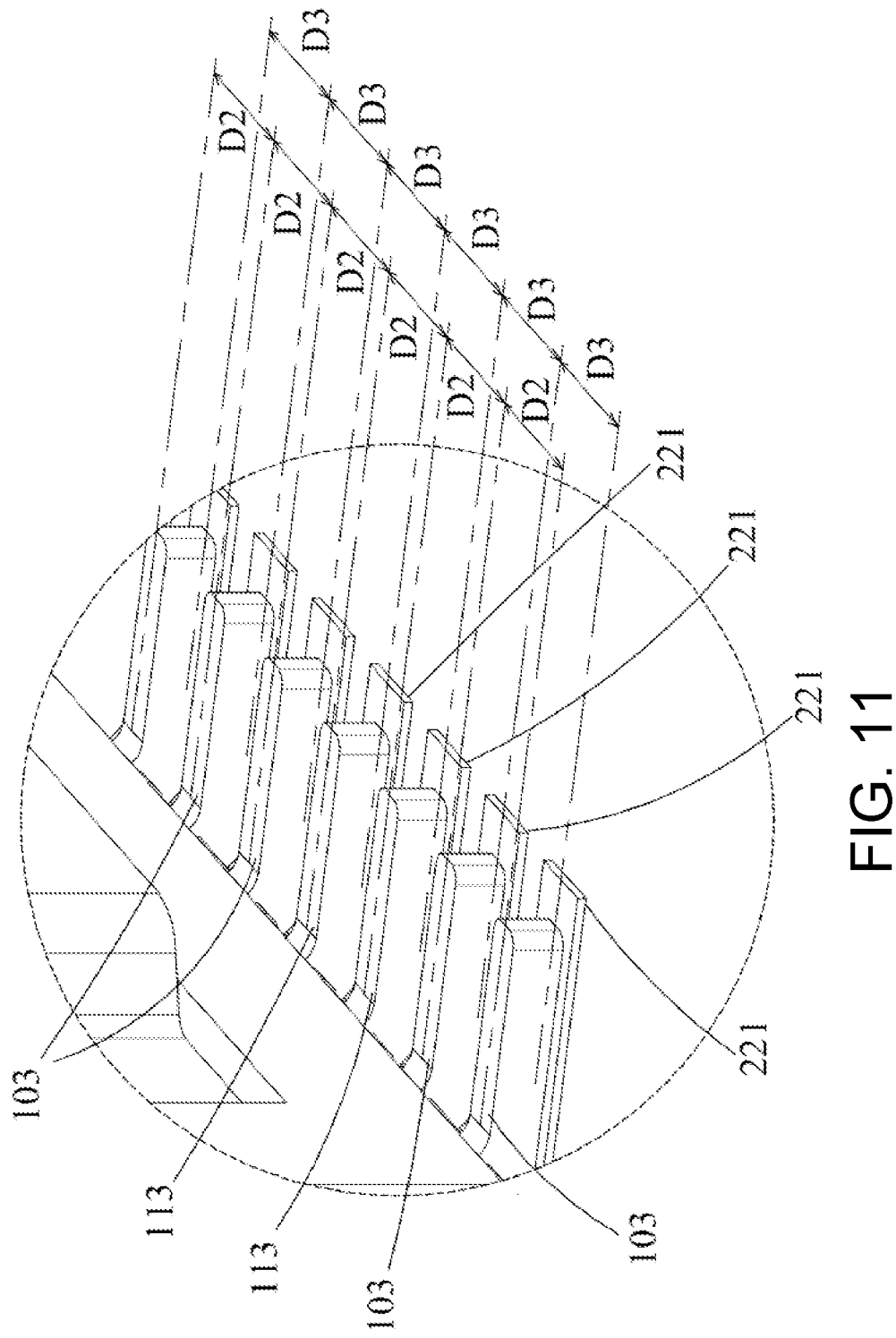
FIG. 11 is an enlarged view of area C of FIG. 8.

FIG. 8 is a perspective view of an electrical connector of the second embodiment of the present disclosure. FIG. 9 is a cross-sectional view along line C-C' of FIG. 8. FIG. 10 is an exploded view of the electrical connector of the second embodiment of the present disclosure. As shown in the figures, the electrical connector 2 of this embodiment comprises a connector body 21, two terminal assemblies 1, and a circuit board 22. The connector body 21 comprises an accommodating groove 211 penetrating a front surface 21a and a rear surface 21b of the connector body 21. In this embodiment, the terminal assembly 1 is the same as the terminal assembly of the first embodiment, wherein the two terminal assemblies 1 are stacked along a third direction Z in the accommodating groove 211. A plurality of ground plugging ends 10a of a plurality of ground terminals 10 of each of the terminal assemblies 1 and a plurality of signal plugging ends 11a of the plurality of signal terminals 11 are close to the front surface 21a of the connector body 21. A plurality of ground connecting ends 10b of the plurality of ground terminals 10 of each of the terminal assemblies 1 and a plurality of signal connecting ends 11b of the plurality of signal terminals 11 protrude from the rear surface 21b of the connector body 21. The circuit board 22 is disposed on one side of the connector body 21. In this embodiment, the circuit board 22 is disposed on a lower surface of the connector body 21. A plurality of conductive pads 221 are provided on a surface of the circuit board 22 close to the connector body 21. In this embodiment, the conductive pads 221 can be sheet-structured or column-structured, and it is sheet-structured and is soldered to the ground assembling pin 103 and the signal assembling pin 113. The plurality of conductive pads 221 are arranged in two rows along a first direction X at intervals. The plurality of ground assembling pins 103 and the plurality of signal assembling pins 113 of each of the terminal assemblies 1 are respectively soldered to the plurality of conductive pads 221 in the same row. FIG. 11 is an enlarged view of area C of FIG. 8. As shown in the figure, a plurality of second distances D2 exist between the plurality of ground assembling pins 103 and a plurality of signal assembling pins 113, and a third distance D3 exists between two adjacent conductive pads 221. The third distance D3 is equal to the second distance D2. Each of the conductive pads 221 comprises a centerline perpendicular to the first direction X. The third distance D3 refers to a distance between two centerlines of two adjacent conductive pads 221. The centerline of each of the ground assembling pins 103 is aligned with the centerline of the corresponding conductive pad 221, and the centerline of each of the signal assembling pins 113 is aligned with the centerline of the corresponding conductive pad 221. In this embodiment, the second distance D2 is 0.6 mm, and the third distance D3 is 0.6 mm.

Figure 12:
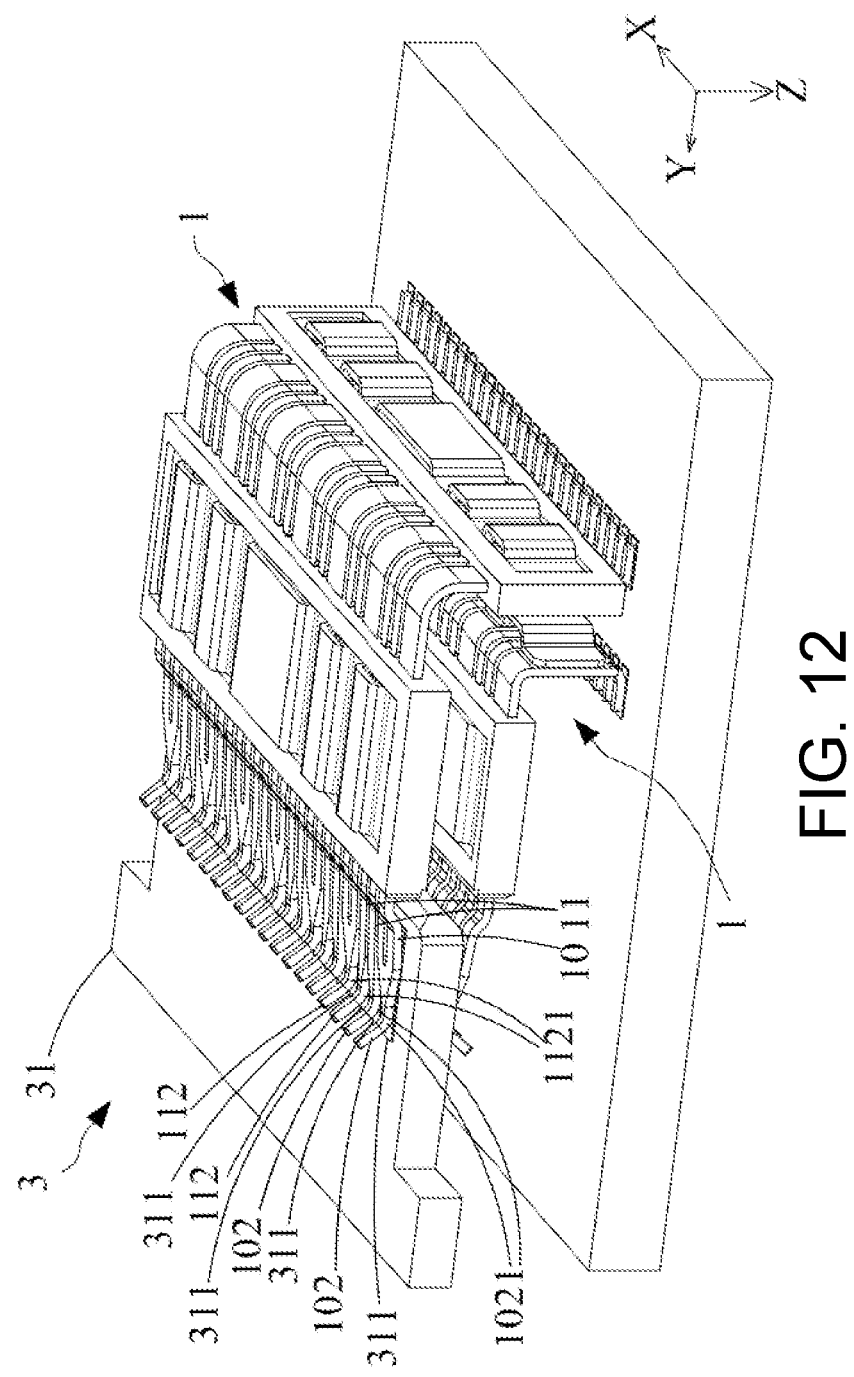
FIG. 12 is a use state diagram of the electrical connector of the second embodiment of the present disclosure.

FIG. 12 is a use state diagram of the electrical connector of the second embodiment of the present disclosure. As shown in the figure, the drawing of the connector body 21 is omitted and only a tongue 31 of the mating connector 3 is presented so that the connecting relationship between each of the terminal assemblies 1 and the mating connector 3 can be seen. When the mating connector 3 is plugged into the electrical connector 2, the tongue 31 of the mating connector 3 would enter the accommodating groove 211 of the connector body 21 through the front surface 21a of the connector body 21 and would be disposed between the two terminal assemblies 1. An upper surface and a lower surface of the tongue 31 are respectively provided with a plurality of contacting pads 311. The plurality of contacting pads 311 on the upper surface are disposed along the first direction X at intervals, and the plurality of contacting pads 311 on the lower surface are also disposed along the first direction X at intervals. A plurality of ground contacting bumps 1021 of the plurality of ground pins 102 and a plurality of signal contacting bumps 1121 of the plurality of signal pins 112 of the upper terminal assembly 1 are respectively contacting with the plurality of contacting pads 311 disposed on the upper surface of the tongue 31. The plurality of ground contacting bumps 1021 of the plurality of ground pins 102 and the plurality of signal contacting bumps 1121 of the plurality of signal pins 112 of the lower terminal assembly 1 are respectively contacting with the plurality of contacting pads 311 disposed on the lower surface of the tongue plate 31.

Figure 13:
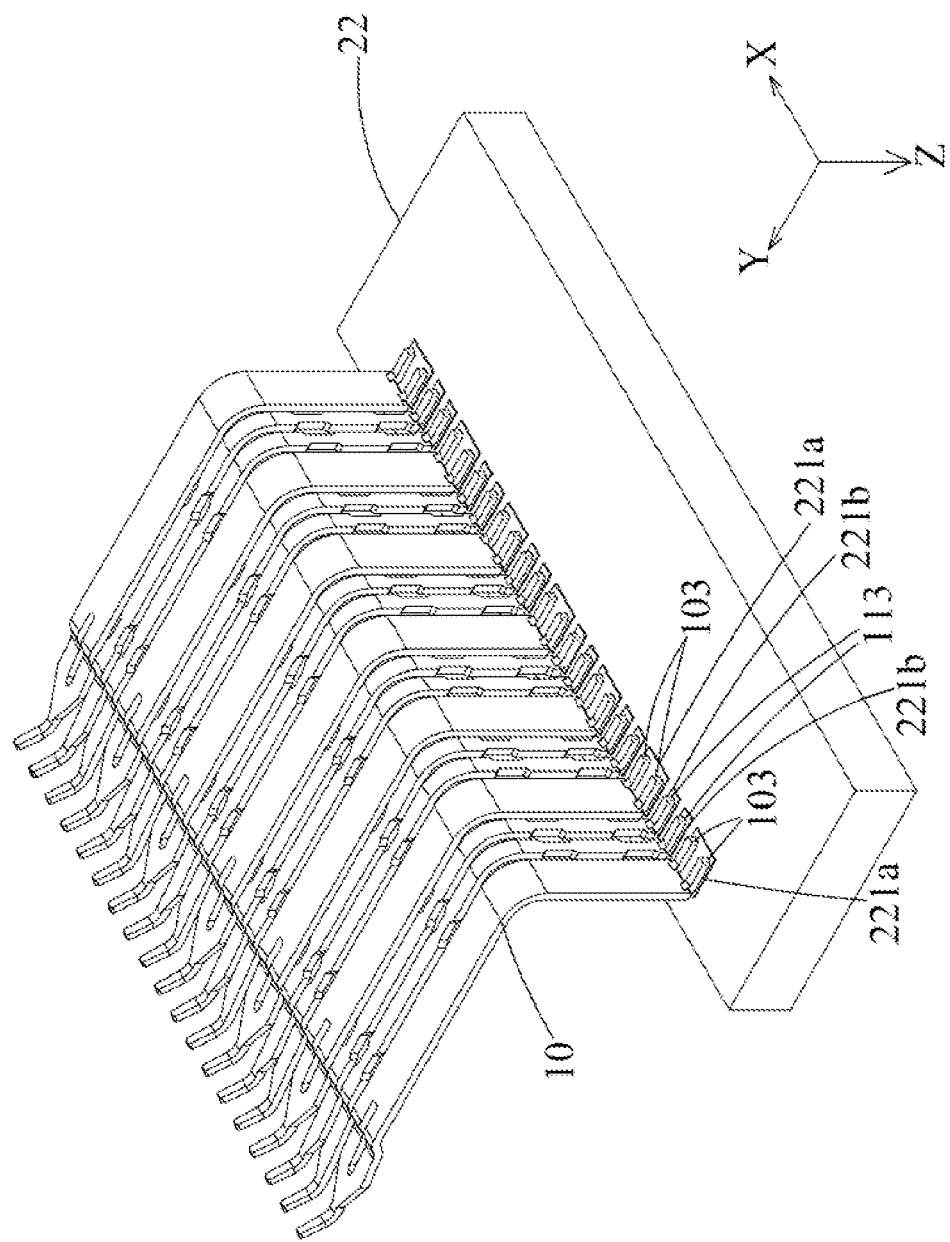
FIG. 13 is a schematic diagram of the connection between a terminal and a circuit board of the third embodiment of the present disclosure.

FIG. 13 is a schematic diagram of the connection between a terminal and a circuit board of the third embodiment of the present disclosure. As shown in the figure, the connection configuration between a plurality of ground terminals 10 and a plurality of signal terminals 11 of the terminal assembly and the circuit board 22 of the electrical connector is described in this embodiment. The circuit board 22 of this embodiment is different from that of the second embodiment in that a plurality of ground assembling pins 103 of one ground terminal 10 of each of the terminal assemblies of this embodiment are soldered to one conductive pad. Thus, the plurality of conductive pads of the circuit board 22 of the electrical connector comprise a plurality of ground conductive pads 221a and a plurality of signal conductive pads 221b, and at least one signal conductive pad 221b is provided between two adjacent ground conductive pads 221a. In this embodiment, two signal conductive pads 221b are provided between two adjacent ground conductive pads 221a. In this embodiment, the plurality of ground assembling pins 103 of one ground terminal 10 of each of the terminal assemblies are soldered to one ground conductive pad 221a, and the plurality of signal assembling pins 113 are respectively soldered to the corresponding signal conductive pads 221b. Thus, a plurality of ground assembling pins 103 arranged at intervals need to be disposed on each of the ground conductive pads 221a. The width of each of the ground conductive pads 221a in the first direction X is wider than the width of each of the signal conductive pads 221b in the first direction X. In this embodiment, it is generally to form a ground conductive pad 221a by connecting two adjacent conductive pads of the second embodiment.

Figure 14:
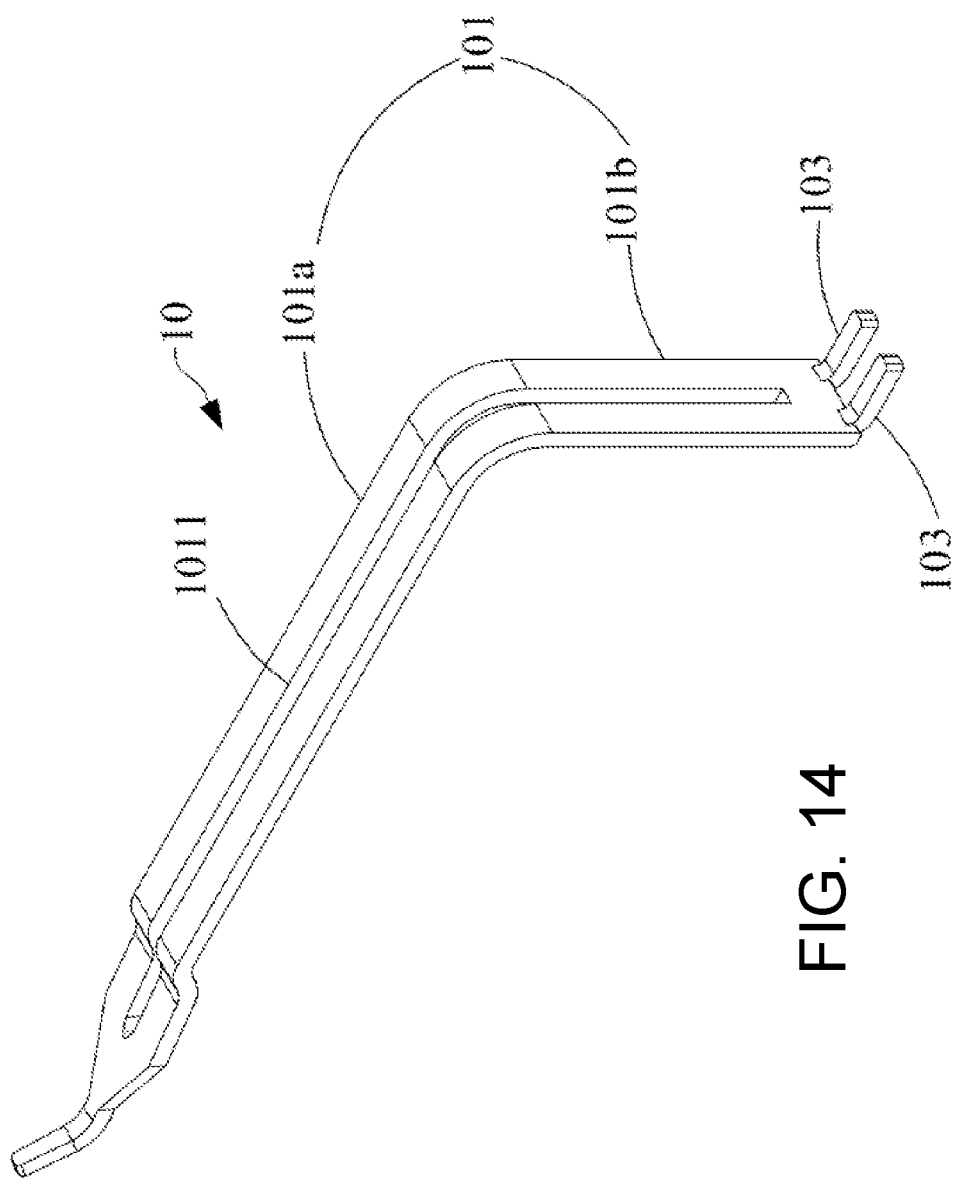
FIG. 14 is a perspective view of a ground terminal of the fourth embodiment of the present disclosure.

FIG. 14 is a perspective view of a ground terminal of the fourth embodiment of the present disclosure. As shown in the figure, the ground terminal 10 of this embodiment is different from that of the first embodiment in that the opening groove 1011 of each of the ground terminals 10 is provided at the first ground end part 101a and the second ground end part 101b without penetrating one end of the second ground end part 101b away from the first ground end part 101a. The extending direction of the opening groove 1011 is between two adjacent ground assembling pins 10. The overall elasticity of the ground terminal body 101 can be increased with the opening groove 1011.

Figure 15:
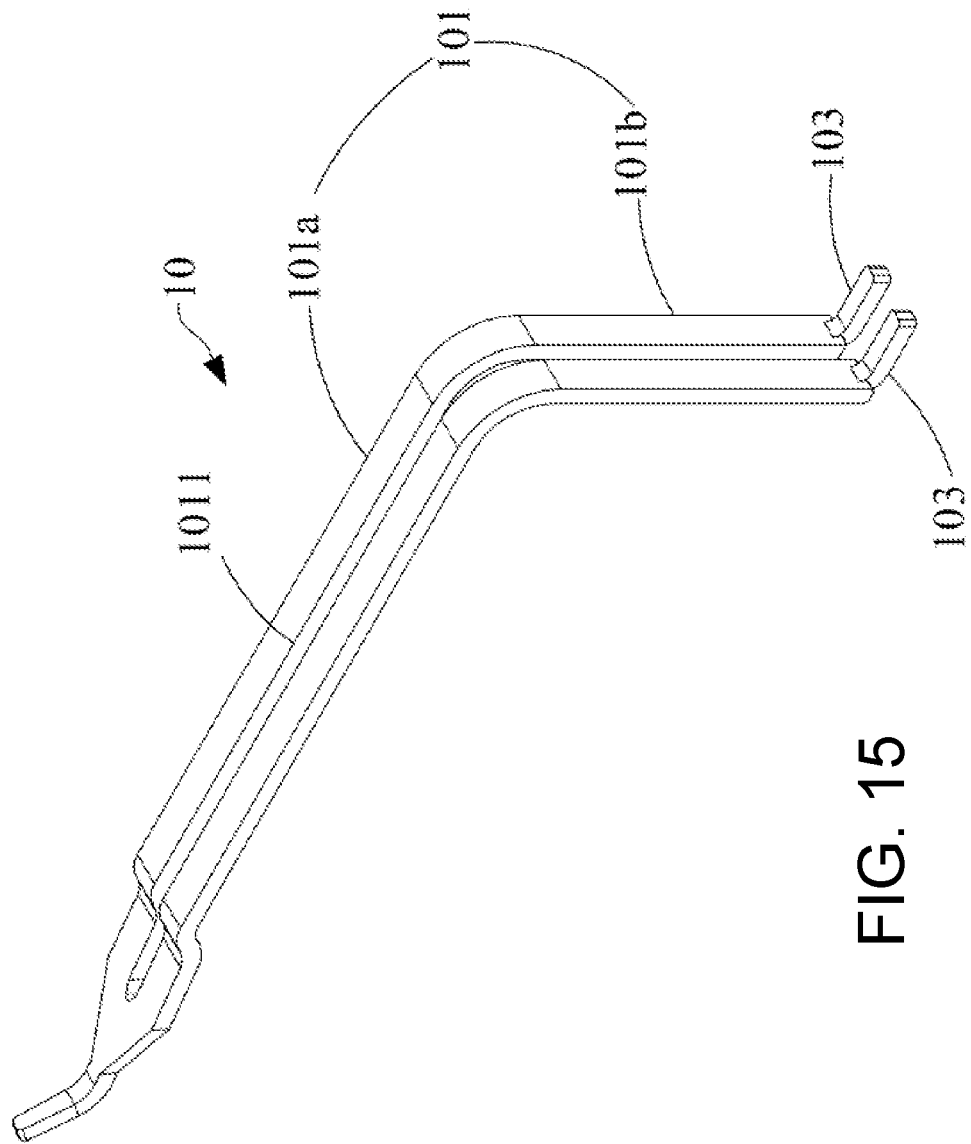
FIG. 15 is a perspective view of a ground terminal of the fifth embodiment of the present disclosure.

FIG. 15 is a perspective view of a ground terminal of the fifth embodiment of the present disclosure. As shown in the figure, the ground terminal 10 of this embodiment is different from that of the fourth embodiment in that the opening groove 1011 of each of the ground terminals 10 is provided at the first ground end part 101a and the second ground end part 101b and penetrates one end of the second ground end part 101b away from the first ground end part 101a. The opening groove 1011 is provided between two adjacent ground assembling pins 103.

Figure 16:
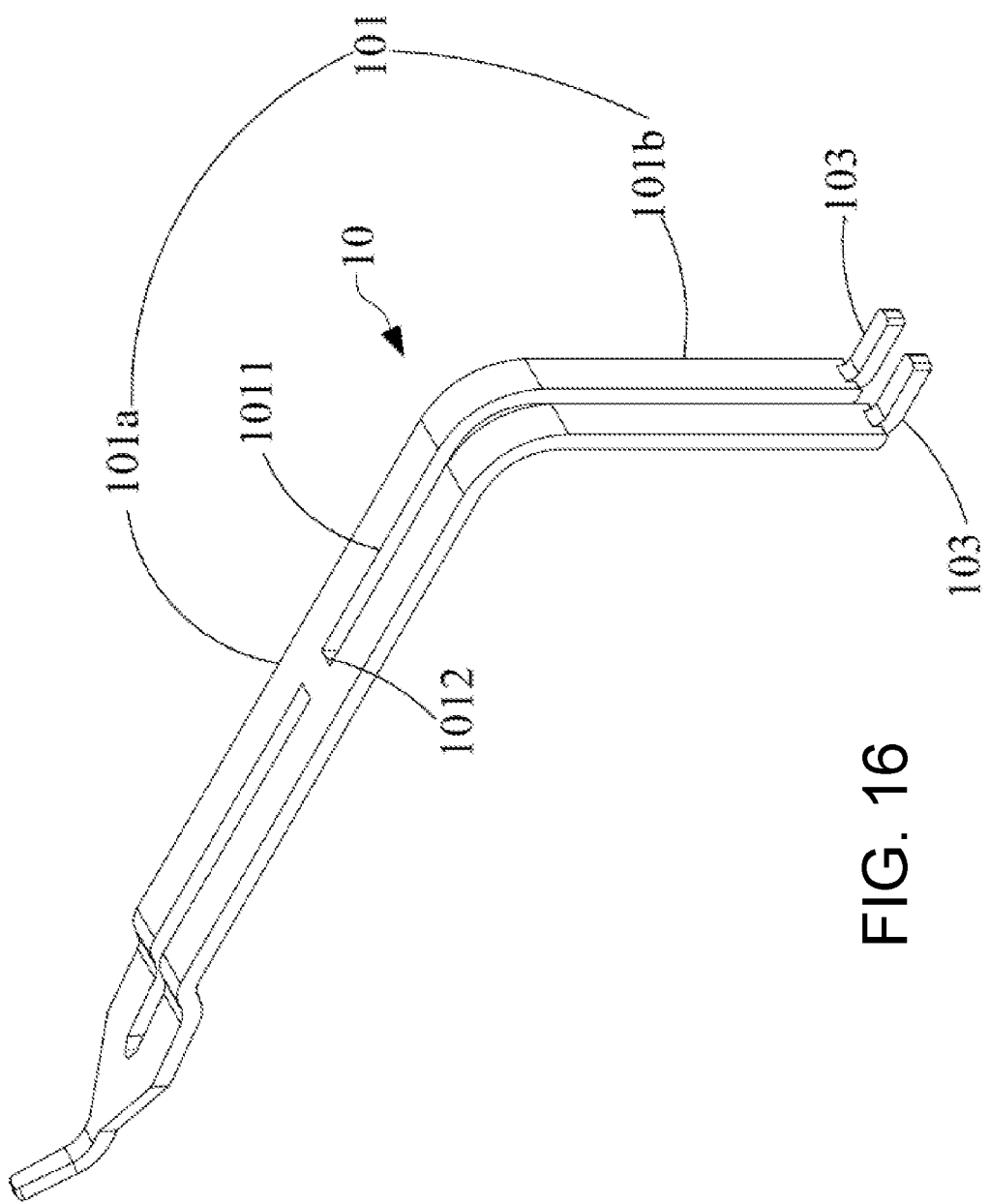
FIG. 16 is a perspective view of a ground terminal of the sixth embodiment of the present disclosure.

FIG. 16 is a perspective view of a ground terminal of the sixth embodiment of the present disclosure. As shown in the figure, the ground terminal 10 of this embodiment is different from that of the fifth embodiment in that a bridging member 1012 is disposed in the opening groove 1011 of each of the ground terminals 10, and is connected with two opposite sidewalls of the opening groove 1011. In this embodiment, the number of the bridging members 1012 is one. The bridging member 1012 is disposed at the first ground end part 101a for increasing the structural strength of the ground terminal body 101. The bridging member 1012 can also be disposed at the second ground end part 101b.

Figure 17:
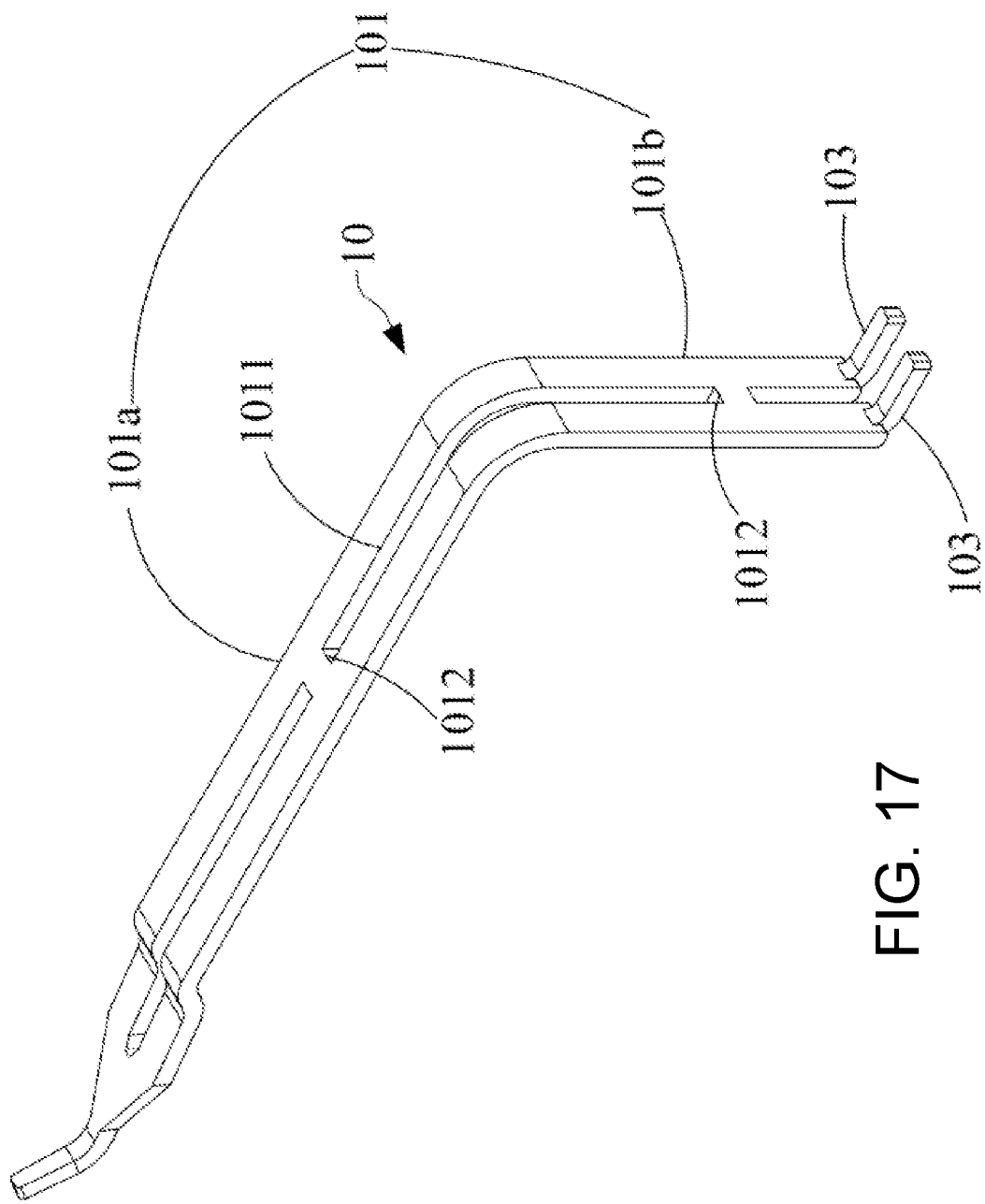
FIG. 17 is a perspective view of a ground terminal of the seventh embodiment of the present disclosure.

FIG. 17 is a perspective view of a ground terminal of the seventh embodiment of the present disclosure. As shown in the figure, the ground terminal 10 of this embodiment is different from that of the sixth embodiment in that the number of bridge members 1012 is two, wherein one bridge member 1012 is disposed on the first ground end part 101a while the other one is disposed on the second ground end part 101b to improve the structural strength of the ground terminal body 101. In another embodiment, the two bridge members 1012 can be disposed at the first ground end part 101a or the second ground end part 101b at the same time. It can be seen from the sixth and seventh embodiments that the number of bridge members 1012 can be one, two, or multiple to enhance the structural strength of the ground terminal body 101 while providing excellent flexibility to the ground terminal body 101.

In summary, the present disclosure proposed a terminal assembly and an electrical connector. By disposing a plurality of ground assembling pins on one ground terminal, the width of the ground terminal can be increased and the signal terminal between the two ground terminals can be effectively protected. Meanwhile, since the distance between the plurality of ground assembling pins and the plurality of signal assembling pins is smaller than the distance between the plurality of ground pins and the plurality of signal pins, the electrical connector of the terminal assembly of the present disclosure could conduct excellent signal transmission rate and SI performance.

It is to be understood that the term "comprises", "comprising", or any other variants thereof, is intended to encompass a non-exclusive inclusion, such that a process, method, article, or device of a series of elements not only include those elements but also comprises other elements that are not explicitly listed, or elements that are inherent to such a process, method, article, or device. An element defined by the phrase "comprising a . . . " does not exclude the presence of the same element in the process, method, article, or device that comprises the element.

Although the present disclosure has been explained in relation to its preferred embodiment, it does not intend to limit the present disclosure. It will be apparent to those skilled in the art having regard to this present disclosure that other modifications of the exemplary embodiments beyond those embodiments specifically described here may be made without departing from the spirit of the disclosure. Accordingly, such modifications are considered within the scope of the disclosure as limited solely by the appended claims.

What is claimed is:

1. A terminal assembly, comprising:
   a plurality of ground terminals, each of the ground terminals comprising a ground terminal body, a ground pin and a plurality of ground assembling pins, the ground pin being disposed at one end of the ground terminal body, the plurality of ground assembling pins being disposed at the other end of the ground terminal body at intervals;
   a plurality of signal terminals, the plurality of signal terminals and the plurality of ground terminals being alternately arranged and disposed at intervals along a first direction, at least one signal terminal being disposed between two adjacent ground terminals, each of the signal terminals comprising a signal terminal body, a signal pin and a signal assembling pin, the signal pin and the signal assembling pin being respectively disposed at two ends of the signal terminal body; and
   an insulating body disposed on the plurality of ground terminal bodies and the plurality of signal terminal bodies;
   wherein a plurality of first distances exist between the plurality of ground pins and the plurality of signal pins; a plurality of second distances exist between the plurality of ground assembling pins and the plurality of signal assembling pins; the first distance is greater than the second distance.

2. The terminal assembly according to claim 1, wherein the first distance is between the adjacent ground pins and the signal pins or between the two adjacent signal pins.

3. The terminal assembly according to claim 2, wherein each of the ground pins and each of the signal pins respectively comprise a centerline perpendicular to the first direction; the first distance equals to a distance between the two centerlines of two adjacent signal pins or equals to a distance between the adjacent centerlines of the ground pins and the signal pins.

4. The terminal assembly according to claim 1, wherein the second distance is between the two adjacent ground assembling pins, or between the two adjacent signal assembling pins, or between the adjacent ground assembling pin and the signal assembling pin.

5. The terminal assembly according to claim 4, wherein each of the ground assembling pins and each of the signal assembling pins comprise a centerline perpendicular to the first direction; the second distance equals to a distance between the two centerlines of the two adjacent signal assembling pins, or between the two centerlines of the two adjacent ground assembling pins, or between the centerlines of the adjacent ground assembling pin and the signal assembling pin.

6. The terminal assembly according to claim 1, wherein the first distance is 0.8 mm wide, and the second distance is 0.6 mm.

7. The terminal assembly according to claim 1, wherein the width of the ground terminal body of each of the ground terminals in the first direction is wider than the width of the signal terminal body of each of the signal terminals in the first direction.

8. The terminal assembly according to claim 1, wherein the ground terminal body of each of the ground terminals comprises a first ground end part and a second ground end part; the extending direction of the first ground end part is orthogonal to the extending direction of the second ground end part; the ground pin is disposed at one end of the first ground end part away from the second ground end part; the plurality of the ground assembling pins are disposed at one end of the second grounding end part away from the first grounding end part at intervals; the signal terminal body of each of the signal terminals comprises a first signal end part and a second signal end part; the extending direction of the first signal end part is orthogonal to the extending direction of the second signal end part; the signal pin is disposed at one end of the first signal end part away from the second signal end part; the signal assembling pin is disposed at one end of the second signal end part away from the first signal end part; the plurality of first ground end parts is parallel to the plurality of first signal end parts; the plurality of first ground end parts and the plurality of first signal end parts extend along the second direction; the plurality of second ground end parts is parallel to the plurality of second signal end parts; the plurality of second ground end parts and the plurality of second signal end parts extend along the third direction; the second direction and the third direction are orthogonal to the first direction.

9. The terminal assembly according to claim 8, wherein the insulating body comprises a first insulator and a second insulator individually disposed; the first insulator is disposed at the plurality of first ground end parts and at the plurality of first signal end parts; the second insulator is disposed at the plurality of second ground end parts and at the plurality of second signal end parts.

10. The terminal assembly according to claim 8, wherein the insulating body is disposed at the plurality of first ground end parts and the plurality of first signal end parts.

11. The terminal assembly according to claim 2, wherein the ground terminal body of each of the ground terminals comprises an opening groove extending from one end of the ground terminal body close to the ground pin toward the ground assembling pin.

12. The terminal assembly according to claim 11, wherein the opening groove penetrates one end of the ground terminal body connected to the ground assembling pin; the opening groove is disposed between the two adjacent ground assembling pins.

13. The terminal assembly according to claim 12, wherein the ground terminal body further comprises a bridging member connecting with two opposite sidewalls of the opening groove.

14. The terminal assembly according to claim 1 further comprising an electromagnetic shielding member disposed on the plurality of ground terminal bodies and the plurality of signal terminal bodies, the electromagnetic shielding member being connected with the plurality of the ground terminal bodies.

15. The terminal assembly according to claim 1, wherein the insulating body comprises a hollow part, form which the plurality of ground terminal bodies and the plurality of signal terminal bodies are exposed.

16. The terminal assembly according to claim 15 further comprising an electromagnetic shielding member disposed on the plurality of ground terminal bodies and the plurality of signal terminal bodies and in the hollow part, the electromagnetic shielding member being connected with the plurality of the ground terminal bodies.

17. The terminal assembly according to claim 14, wherein the electromagnetic shielding member comprises a plurality of bumps and a plurality of recesses arranged alternately; the plurality of bumps are connected to the plurality of ground terminal bodies; the plurality of recesses correspond to the plurality of signal terminal bodies.

18. The terminal assembly according to claim 16, wherein the electromagnetic shielding member comprises a plurality of bumps and a plurality of recesses arranged alternately; the plurality of bumps are connected to the plurality of ground terminal bodies; the plurality of recesses correspond to the plurality of signal terminal bodies.

19. The terminal assembly according to claim 17, wherein the electromagnetic shielding member is wave-shaped.

20. The terminal assembly according to claim 18, wherein the electromagnetic shielding member is wave-shaped.

21. The terminal assembly according to claim 1, wherein the width of one end of each of the ground terminal bodies connected to the ground pin in the first direction is narrower than the width of the ground terminal body in the first direction and is equal to the width of the ground pin in the first direction.

22. The terminal assembly according to claim 1, wherein the width of one end of each of the signal terminal bodies connected to the signal pin in the first direction is narrower than the width of the signal terminal body in the first direction and is equal to the width of the signal pin in the first direction.

23. An electrical connector, comprising:
a connector body comprising an accommodating groove;
two terminal assemblies stacked in the accommodating groove, comprising:
a plurality of ground terminals, each of the ground terminals comprising a ground terminal body, a ground pin and a plurality of ground assembling pins, the ground pin being disposed at one end of the ground terminal body, the plurality of ground assembling pins being disposed at the other end of the ground terminal body at intervals;
a plurality of signal terminals, the plurality of signal terminals and the plurality of ground terminals being alternately arranged and disposed at intervals along a first direction, at least one signal terminal being disposed between two adjacent ground terminals, each of the signal terminals comprising a signal terminal body, a signal pin and a signal assembling pin, the signal pin and the signal assembling pin being respectively disposed at two ends of the signal terminal body; and
an insulating body disposed on the plurality of ground terminal bodies and the plurality of signal terminal bodies;
wherein a plurality of first distances exist between the plurality of ground pins and the plurality of signal pins; a plurality of second distances exist between the plurality of ground assembling pins and the plurality of signal assembling pins; the first distance is greater than the second distance; and
a circuit board disposed on the connector body, a surface of the circuit board close to the connector body being provided with a plurality of conductive pads arranged along the first direction at intervals, the plurality of the ground assembling pins and the plurality of the signal assembling pins being respectively soldered to the corresponding conductive pads.

24. The electrical connector according to claim 23, wherein a plurality of third distances exist among the plurality of conductive pads; the third distance is equal to the second distance.

25. The electrical connector according to claim 23, wherein each of the conductive pads comprises a centerline perpendicular to the first direction; the third distance equals to a distance between the two centerlines of the two adjacent conductive pads.

26. The electrical connector according to claim 23, wherein the plurality of conductive pads comprises a plurality of ground conductive pads and a plurality of signal conductive pads; at least one signal conductive pad is disposed between two adjacent ground conductive pads; the plurality of ground assembling pins of each of the ground terminals are soldered to the corresponding ground conductive pad; the signal assembling pin of each of the signal terminals is soldered to the corresponding signal conductive pad.

27. The electrical connector according to claim 26, wherein the width of the ground conductive pad in the first direction is wider than the width of the signal conductive pad in the first direction.

* * * * *